(12) United States Patent
Goto et al.

(10) Patent No.: US 10,636,723 B2
(45) Date of Patent: Apr. 28, 2020

(54) HEAT DISSIPATION COMPONENT AND METHOD FOR MANUFACTURING SAME

(71) Applicant: DENKA COMPANY LIMITED, Tokyo (JP)

(72) Inventors: Daisuke Goto, Omuta (JP); Takeshi Miyakawa, Omuta (JP); Yosuke Ishihara, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 530 days.

(21) Appl. No.: 15/501,913

(22) PCT Filed: Aug. 5, 2015

(86) PCT No.: PCT/JP2015/072247
§ 371 (c)(1),
(2) Date: Jun. 26, 2017

(87) PCT Pub. No.: WO2016/021645
PCT Pub. Date: Feb. 11, 2016

(65) Prior Publication Data
US 2017/0317007 A1    Nov. 2, 2017

(30) Foreign Application Priority Data

Aug. 6, 2014 (JP) ................................ 2014-160859

(51) Int. Cl.
*H01L 23/373* (2006.01)
*H01L 23/14* (2006.01)
(Continued)

(52) U.S. Cl.
CPC ............ *H01L 23/3733* (2013.01); *C22F 1/04* (2013.01); *H01L 21/4878* (2013.01);
(Continued)

(58) Field of Classification Search
CPC ......... H01L 2924/0002; H01L 2924/00; H01L 21/4878; H01L 23/12; H01L 23/14;
(Continued)

(56) References Cited

U.S. PATENT DOCUMENTS

2015/0041187 A1* 2/2015 Hori .................... H01L 23/3735
174/252

FOREIGN PATENT DOCUMENTS

JP    H05-507030 A    10/1993
JP    H11-330308 A    11/1999
(Continued)

OTHER PUBLICATIONS

Oct. 20, 2015 International Search Report issued in International Patent Application No. PCT/JP2015/072247.

*Primary Examiner* — Jenny R Wu
(74) *Attorney, Agent, or Firm* — Oliff PLC

(57) ABSTRACT

To provide a method for manufacturing a heat dissipation component having excellent heat dissipation properties, in which there is minimal return of warping after the bonding of a circuit board, and to provide a heat dissipation component manufactured using the method. Provided is a method for manufacturing a warped flat-plate-shaped heat dissipation component containing a composite part that comprises silicon carbide and an aluminum alloy, wherein the method for manufacturing the heat dissipation component is characterized in that the heat dissipation component is sandwiched in a concave-convex mold having a surface temperature of at least 450° C. and having a pair of opposing spherical surfaces measuring 7000-30,000 mm in curvature radius, and pressure is applied for 30 seconds or more at a stress of 10 kPa or more such that the temperature of the heat dissipation component reaches at least 450° C.

4 Claims, 1 Drawing Sheet

(51) Int. Cl.
   *H01L 23/12* (2006.01)
   *H01L 23/36* (2006.01)
   *C22F 1/04* (2006.01)
   *H01L 21/48* (2006.01)
   *H01L 23/367* (2006.01)

(52) U.S. Cl.
   CPC .............. *H01L 23/12* (2013.01); *H01L 23/14* (2013.01); *H01L 23/36* (2013.01); *H01L 23/367* (2013.01); *H01L 2924/0002* (2013.01)

(58) Field of Classification Search
   CPC ... H01L 23/36; H01L 23/367; H01L 23/3733; C22F 1/04
   See application file for complete search history.

(56) References Cited

FOREIGN PATENT DOCUMENTS

JP  2004-047619 A     2/2004
   JP  2004047619 A  *  2/2004
   WO  91/017011 A1   11/1991

\* cited by examiner

[Figure 1]
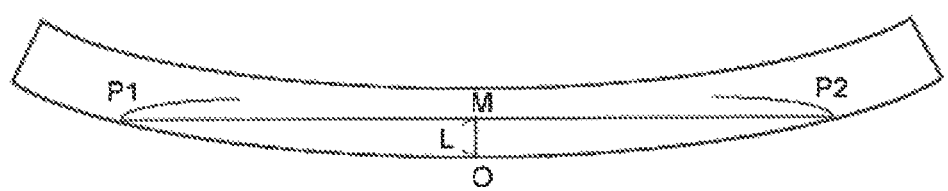
[Figure 2]
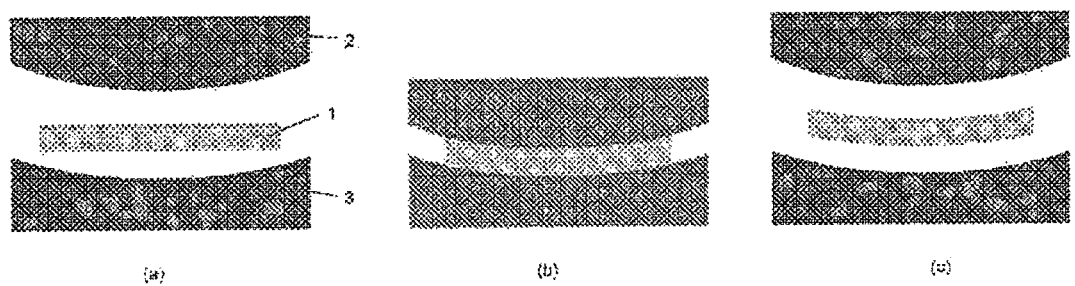

HEAT DISSIPATION COMPONENT AND METHOD FOR MANUFACTURING SAME

TECHNICAL FIELD

The present invention relates to a heat dissipation component and a method for manufacturing the same.

BACKGROUND ART

In order to radiate heat generated from semiconductor elements, base plates are joined to circuit boards to which semiconductor elements have been mounted and furthermore, heat dissipation components such as radiating fins are joined to the opposite plate surfaces of the base plates. Aluminum or composites comprising aluminum alloys and silicon carbide, having high thermal conductivity and thermal expansion coefficients close to that of the circuit boards to which they are joined, are used as base plates for such a purpose (Patent Document 1).

When using flat base plates for the above purpose, the stress generated due to the difference in the thermal expansion coefficient of the base plates and the circuit boards when the two are joined or the stress generated when packaging with resin sealants, etc. thereafter causes the base plate surface side in close contact with the radiating fins, etc. to warp concavely, and sufficient adhesion cannot be obtained when fixing radiating fins to base plates.

As means to solve this problem, there is art directed to warping the plate surface of base plates that are joined to radiating fins, etc. into convex shapes ahead of time (Patent Document 2).

Patent Document 1 JP H05-507030 A
Patent Document 2 JP H11-330308 A

SUMMARY OF THE INVENTION

However, there is the problem in conventional warp processing of, in environments such as heat cycling after mounting, the warping of the base plates fluctuating.
Further, in methods in which warping is provided by heat processing while applying stress to a base plate, after soldering of ceramic substrates to base plates and packaging with resin sealants, etc., there is the problem of so-called warp return being significant, wherein the surface of the side brought into close contact with the intended radiating fins is not convex but has a concave warped shape, resulting in poor heat dissipation.

According to the present invention, a method for manufacturing heat dissipation components having superior heat dissipation and small warp return after joining to a circuit board and heat dissipation components manufactured via this method for manufacturing are provided.

The present invention provides a manufacturing method for a flat plate-shaped heat dissipation component having warp and including a composite part comprising silicon carbide and an aluminum alloy, wherein the method for manufacturing the heat dissipation component is characterized in that the heat dissipation component is sandwiched in a concave-convex mold that has a surface temperature of at least 450° C. and that has a pair of opposing spherical surfaces with a curvature radius of 7,000-30,000 mm, and in that pressing is performed for 30 seconds or more at a stress of 10 KPa or more such that the temperature of the heat dissipation component reaches at least 450° C.

According to one embodiment of the present invention, the manufacturing method is characterized in that the curvature radius is 20,000-30,000 mm.

According to one embodiment of the present invention, the heat dissipation component manufactured by the manufacturing method is characterized in that, when the amount of warp per 10 an prior to the warp being provided is set at X, the amount of warp per 10 cm after the warp has been provided is set at (X+Y), and that when the amount of warp per 10 cm after heat treating the heat dissipation component after warping at a temperature no greater than 320° C. for at least 1 hour is set at (X+Z), Y and Z satisfy the relationship $(Y-Z)<(Y/2)$.

According to one embodiment of the present invention, the manufacturing method is characterized by $(Y-Z)$ being no greater than 18 µm.

According to one embodiment of the present invention, the manufacturing method is characterized by $(Y/2)-(Y-Z)$ being 1-80 µm.

Further, according to the present invention, a heat dissipation component is provided by any of the preceding manufacturing methods.

According to the present invention, a manufacturing method for a heat dissipation component having superior heat dissipation and small warp return after joining a circuit board and a heat dissipation component manufactured thereby can be provided.

SIMPLE EXPLANATION OF THE DRAWINGS

FIG. 1 A drawing explaining the amount of warp in a heat dissipation component.

FIG. 2 A conceptual drawing explaining the press structure of the manufacturing method of an embodiment of the present invention, FIG. 2(a) shows the pre-press state, FIG. 2(b) shows the state during pressing, and FIG. 2(c) shows the post-press state.

MODES FOR CARRYING OUT THE INVENTION

Below, the present invention shall be explained in further detail via embodiments. However, it is self-evident that the present invention is not limited to these embodiments.

In the present invention, the "amount of warp" is defined by taking the central part of a flat plate-shaped heat dissipation component (the central part of a heat dissipation component may be the intersection of diagonal lines on a roughly rectangular plate surface in a heat dissipation component) as the center point, imagining straight lines connecting the endpoints of line segments in the long side direction or in the short side direction of the plate surface of the heat dissipation component to one another, and measuring, among lines perpendicular to the straight lines, the length of a perpendicular line passing through the central part, which is the amount of warp.

For instance, in the example in FIG. 1, central part O of the heat dissipation component is the center point and P1 and P2 are the endpoints of line segments in the long side direction or the short side direction. Imagining a straight line connecting P1 and P2, L is the length of a perpendicular line drawn from the straight line to central part O. At this time, setting the length of the straight line connecting P1 and P2 as M, the value of length L against length M is the amount of warp. For example, when length M is 10 cm, a value equivalent to length L is the amount of warp per 10 cm.

In the present invention, "spherical surface" can be defined as a curved surface created when a curved line on a flat surface is rotated around a straight line on the flat surface.

The manufacturing method for a heat dissipation component in the present embodiment is a manufacturing method for a flat plate-shaped heat dissipation component having warp and including a composite part comprising silicon carbide and an aluminum alloy, characterized in that the heat dissipation component is sandwiched in a concave-convex mold having a surface temperature of at least 450° C. and a pair of opposing spherical surfaces with a curvature radius of 7,000-30,000 mm, and in that pressing is performed for 30 seconds or more at a stress of 10 KPa or greater such that the temperature of the heat dissipation component reaches at least 450° C.

Via the manufacturing method provided with the above configuration, a heat dissipation component having superior heat dissipation due to good adhesion when contacting other heat dissipation components such as radiating fins and in which warp return is small is provided. As a result, it is possible to steadily and productively obtain high-reliability modules having semiconductor elements and the like mounted thereto.

In the present embodiment, a mold comprising two molds—a concave mold having a spherical shape with a curvature radius of 7,000-30,000 mm and a convex mold having a spherical shape with a curvature radius identical to that of the spherical surface, (hereafter, this pair of molds is referred to as a concave-convex mold) is used when applying stress to the total surface of a base plate (heat dissipation component). A method wherein the base plate is sandwiched between the spherical surfaces of the concave-convex mold plate and, while stress is applied in the direction in which the base plate is sandwiched (while so-called pressing is performed), the base plate is heated, is adopted.

In the above method, a method wherein the pair of molds is heated after the base plate is sandwiched ahead of time and pressing is performed with a press, a method in which a load is applied, a method in which a base plate is inserted into a pair of molds already heated to a predetermined temperature and in which pressing is performed, or a method in which, at this time, a base plate has already been heated, etc. may be adopted.

A press mold is as shown in FIG. 2 and has a press convex mold 2 and a press concave mold 3 that sandwich a heat dissipation component 1 (FIG. 2($a$)). The pair of the press convex mold 2 and the press concave mold 3 face one another and sandwich the heat dissipation component 1 (FIG. 2($b$)) and via the use of a heating press under the above conditions, a predetermined warp is provided to the heat dissipation component 1 (FIG. 2($c$)).

Via the above method, a warp amount of 5-200 μm per 10 cm in the long side direction and in the short side direction may be provided to the heat dissipation component 1.

When joining circuit boards, due to differences in thermal expansion coefficients thereof, forces generally work in heat dissipation components such that convex surfaces face concave surfaces, thus, depending on the shape of a heat dissipation component, regions in which parts have a concave shape can readily develop, but by making warp spherical, even if the aforementioned forces act, deformation is not to the degree that some regions become concave, so joining of radiating fins, etc. is sufficiently maintained when in modules and high-reliability modules can be obtained.

In the present embodiment, the composite comprises an aluminum alloy and silicon carbide, so in the provision of warp, it is preferable that the base plate be heated to a temperature as high as possible within a temperature range in which the aluminum or aluminum alloy part that is the matrix of the composite does not melt, and it is specifically suitable that treatment be performed in a temperature range of about 450-550° C.

Further, stress of 10 KPa or greater is good and preferably should be from 30 KPa to 250 KPa. The optimum stress may be determined experimentally in accordance with the plate thickness of the base plate, the temperature when warp is provided, etc.

In the present embodiment, it is standard for the heat dissipation component to be heated by being sandwiched between heated spherical molds that face one another. Accordingly, for the composite itself to reach a temperature of at least 450° C., though it is affected by the thickness, surface area, etc. of the composite, if the heat dissipation component is pressed for 30 to 300 seconds while the temperature of the heat dissipation component itself is substantially at least 450° C., a heat dissipation component having the characteristics of the present embodiment can be obtained.

The material of the pair of the concave and convex molds used in the present embodiment does not matter as long as the material can maintain the shape of the mold for the specified time at the heat treatment temperature of the present embodiment, but it is preferable that a ceramic material such as carbon or boron nitride, or a metal material such as an cemented carbide or stainless steel be used.

The press surfaces of the pair of press molds for pressing the heat dissipation component may have spherical shapes with a curvature radius of 20,000-30,000 mm. By having a curvature radius of 20,000-30,000 mm, variations in the amount of warp due to heat treatment can be made small.

The heat dissipation component may be configured such that Y and Z satisfy the relationship (Y−Z)<(Y/2) where X is the amount of warp per 10 cm prior to warp being provided, (X+Y) is the amount of warp per 10 cm after the warp has been provided, and (X+Z) is the amount of warp per 10 cm after heat treating the heat dissipation component at a temperature no greater than 320° C. for at least 1 hour following the warp being provided.

Concerning the provision of warp, the amount of warp per 10 cm prior to warp being provided is X μm, wherein when the amount of warp per 10 cm after the warp has been provided is (X+Y) μm, the amount of warp per 10 cm provided is Y μm. In addition, the amount of warp return is defined as (Y−Z) μm in cases in which a heat dissipation component in which the amount of warp per 10 cm is (X+Y) μm is heated at a temperature no greater than 320° C. for at least 1 hour and the amount of warp per 10 cm is (X+Z) μm. In the above manufacturing method, by (Y−Z) satisfying the relationship (Y−Z)<(Y/2), warp return is small and a heat dissipation component having superior heat dissipation can be provided.

By defining the relationship between the amount of warp prior to and following heat treatment for at least 1 hour at the abovementioned temperature as described above, the amount of warp provided can be maintained at 50% or greater and, as a result, after actually soldering a ceramic circuit board or the like and furthermore, even after packaging with a resin sealant, etc., the radiating fin-fixing side of the heat dissipation component is maintained in a convex state, and a module having excellent heat dissipation can be obtained.

(Y−Z) may be 18 μm or less. Due to the amount of warp return before and after heat treatment being 18 μm or less, the shape of the heat dissipation component is kept uniform and a heat dissipation component with can productively be manufactured.

(Y−2)−(Y−Z) may be in the range 1-80 μm. By setting to this range, a heat dissipation component having even better adhesion and superior heat dissipation can be manufactured.

According to the manufacturing method of the present embodiment, a heat dissipation component having small amount of warp return after heating and warp with a shape close to a spherical surface can be obtained.

A composite comprising both aluminum or an aluminum alloy and silicon carbide in a three-dimensional network structure is preferably applied as the composite comprising an aluminum alloy and silicon carbide used in the present embodiment, and it is even more preferable that a composite obtained by setting silicon carbide powder particles as a molded body and by impregnating a cavity of the molded body with aluminum or an alloy including aluminum, the composite having high thermal conductivity and a low expansion coefficient be used.

In order to obtain such a composite, for instance, high-pressure forging can be used. In high-pressure forging, with the objective of protecting against defects such as cracks occurring during the step of impregnating aluminum or an aluminum alloy (hereafter referred to simply as aluminum), which will be discussed below, and of the obtained composite satisfying properties such as high thermal conductivity, a low expansion coefficient, and high strength, the silicon carbide is made into a molded body (preform) ahead of time, which can be impregnated with aluminum.

As a manufacturing method for a silicon carbide preform, widely-known methods such as a method in which a mixed powder in which silicon carbide powder, an organic binder, an inorganic binder to maintain strength following firing, etc. are mixed is, after press molding, fired and preformed in air or an inert atmosphere, a method in which, following the further addition of water or a solvent and a plasticizing agent, dispersing agent, or the like to the mixed powder and kneading, the mixed powder is extrusion molded and fired, an injection method wherein the mixture is made into a low-viscosity slurry, injection molded in a mold, and fired, or a wet-pressing molding method wherein the slurry is packed into a mold having a predetermined absorbency and press molded can be adopted.

When used in the present embodiment, the content percentage of the silicon carbide can be appropriately selected in accordance with the use, but to obtain an aluminum-silicon carbide material base plate having high thermal conductivity and an expansion coefficient of about 6-9 ppm/K, regardless of the method used to manufacture a preform, it is preferable that the relative density of the preform is at least 50% and more preferably is at least 60%. In order to do so, it is effective to appropriately mix two or more raw material powders having different particle sizes as the silicon carbide raw material. The relative density can be measured via Archimedes' Method, etc.

In the step of impregnating a preform with aluminum and making a composite, an aluminum-silicon carbide composite is manufactured by feeding molten aluminum into the mold after the silicon carbide preform is set in the same, aluminum is impregnated in a cavity in the preform by pressing the molten aluminum, and cooling.

In order to smoothly perform impregnation at this time, the preform is pre-heated. Further, with the objective of improving low-temperature melting, ease of impregnation, and mechanical properties following impregnation, an aluminum-silicon based alloy containing 6-18 mass % silicon or, with the further objective of improving wettability with the preform, an aluminum-silicon-magnesium based alloy to which 3 mass % of magnesium has been added, is used as the aluminum raw material to be impregnated.

The alloy to be used can be selected arbitrarily, but in general, an aluminum alloy melted at a temperature of 800-900° C. is impregnated. An aluminum-silicon carbide material composite manufactured via the above method is, as-is or after the surfaces and periphery thereof are subsequently machined into a predetermined shape and surface processing such as plating performed as necessary, made into a heat dissipation component.

The heat dissipation component obtained through the above steps is, as stated above, flat and while uncontrolled warp does exist, according to the method of the present embodiment, the heat dissipation component is one in which the amount of spherical warp is controlled.

According to the above method of manufacturing for a heat dissipation component of the present embodiment, a heat dissipation component having high adhesion with radiating fins even after being joined by soldering with a ceramic circuit board or packaging with a resin sealant, etc. Is provided.

EXAMPLES

Hereafter, the present invention shall be explained based on examples and comparative examples.

Example 1

A preform having a relative density of 65%, comprising silicon carbide, and having dimensions of 179 mm×129 mm with a thickness of 4.9 mm was set in a mold with a spout having a cavity with dimensions of 182 mm×132 mm and a depth of 5.0 mm.
After heating at 600° C. for 1 hour, molten aluminum containing 12 mass % of silicon and 0.9 mass % of magnesium was then poured and via high-pressure pressing, a cavity in the preform was impregnated with the aluminum alloy. After cooling, an aluminum-silicon carbide composite was obtained by removing same from the mold.

By machining the periphery of the obtained composite, the composite was made into a base plate having dimensions of 180 mm (referred to as the long side)×130 mm (referred to as the short side) and a thickness of 5 mm. At this time, the surface was covered by the aluminum alloy.

The amount of warp in the base plate was measured. Measurement of the amount of warp was performed with a three-dimensional laser shape measurement device (LK-G500 manufactured by Keyence Corporation) and the measurement range was set so the center of the base plate was the center point, at 100 mm in the long side direction and 100 mm in the short side direction.
The measurement positions in the long side direction and in the short side direction were both lines passing through the center of the base plate. The results of measuring the amount of warp indicated a warped shape in which one side was convex in both the long side direction and the short side direction and in which the opposite surface was concave. Regarding the convex surface, the maximum height on the line when both edges of the measurement range are converted to zero, that is, the amount of warp, was investigated, coming to 16 μm in the long side direction and 14 μm in the short side direction.

In order to provide warp to the base plate, a concave-convex mold made of stainless steel and provided with spherical surfaces having a curvature radius of 10,000 mm was prepared. The concave-convex mold was mounted in a heat press and heated until the surface temperature of the mold was 460° C. The base plate was placed inside the concave-convex mold and pressed at 40 KPa. At this time, the temperature was measured by contacting a thermocouple with a side surface of the base plate. After maintaining for 3 minutes from the time the temperature of the base plate became 450° C., rapid cooling was initiated and the pressure released.

The results of measuring the amount of warp on the convex surface side of the obtained base plate were 135 μm in the long side direction and 122 μm in the short side direction.

After further heating the base plate for 2 hours at 320° C., the results of measuring the amount of warp were 122 μm in the long side direction and 111 μm in the short side direction. These results are shown in Tables 1 and 2.

TABLE 1

| | Concave-Convex Mold | Warp Provision | Press | Press | Amount of Warp Before Warp Provision (μm) | | Amount of Warp After Warp Provision (μm) | | Heat Treatment Conditions After Warp Provision | | Amount of Warp After Heat Treatment (μm) | |
|---|---|---|---|---|---|---|---|---|---|---|---|---|
| | Curvature Radius (mm) | Temperature (° C.) | Pressure (kPa) | Time (min.) | Long Side | Short Side | Long Side | Short Side | Temperature (° C.) | Time | Long Side | Short Side |
| Example 1 | 10000 | 450 | 40 | 3 | 16 | 14 | 135 | 122 | 320 | 2 | 122 | 111 |
| Example 2 | 7000 | 450 | 40 | 3 | 15 | 2 | 189 | 177 | 320 | 2 | 181 | 165 |
| Example 3 | 20000 | 450 | 40 | 3 | 10 | 14 | 68 | 75 | 320 | 2 | 60 | 72 |
| Example 4 | 30000 | 450 | 40 | 3 | 22 | 8 | 58 | 47 | 320 | 2 | 54 | 46 |
| Example 5 | 10000 | 550 | 10 | 0.5 | 4 | 11 | 118 | 120 | 320 | 2 | 102 | 108 |
| Example 6 | 10000 | 520 | 30 | 4 | 12 | 16 | 124 | 130 | 320 | 2 | 122 | 124 |
| Example 7 | 15000 | 550 | 10 | 0.5 | 12 | 17 | 105 | 101 | 270 | 3 | 98 | 96 |
| Example 8 | 15000 | 450 | 40 | 4 | 5 | 30 | 99 | 94 | 270 | 3 | 94 | 94 |
| Example 9 | 15000 | 520 | 30 | 3 | 16 | 22 | 123 | 116 | 270 | 3 | 120 | 117 |
| Comparative Example 1 | 10000 | 550 | 8 | 3 | 32 | 6 | 154 | 146 | 320 | 2 | 72 | 61 |
| Comparative Example 2 | 10000 | 430 | 10 | 0.5 | 15 | 26 | 104 | 108 | 320 | 2 | 58 | 62 |
| Comparative Example 3 | 10000 | 520 | 30 | 0.25 | 5 | 14 | 68 | 74 | 320 | 2 | 42 | 41 |
| Comparative Example 4 | 15000 | 650 | 10 | 0.25 | 18 | 5 | 106 | 120 | 270 | 3 | 60 | 54 |
| Comparative Example 5 | 5000 | 450 | 40 | 4 | 16 | 18 | — | — | — | — | — | — |
| Comparative Example 6 | 35000 | 450 | 40 | 3 | 6 | 15 | 28 | 32 | 320 | 2 | 15 | 17 |
| Comparative Example 7 | — | 550 | — | 30 | 15 | 27 | 162 | 154 | 320 | 2 | 78 | 80 |
| Comparative Example 8 | — | 450 | — | 30 | 21 | 5 | 134 | 126 | 320 | 1 | 64 | 62 |

TABLE 2

| | Is (Y − Z) < (Y/2) satisfied? | | Difference in the Amount of Warp Before and After Heat Treatment (Y − Z) | | Amount of Provided Warp/2 (Y/2) | | (Y/2) − (Y − Z) | | (Y − Z)/Y | |
|---|---|---|---|---|---|---|---|---|---|---|
| | Long Side | Short Side | Long Side | Short Side | Long Side | Short Side | Long Side | Short Side | Long Side | Short Side |
| Example 1 | Y | Y | 13 | 11 | 59.5 | 54 | 46.5 | 43 | 11% | 10% |
| Example 2 | Y | Y | 8 | 12 | 87 | 87.5 | 79 | 75.5 | 5% | 7% |
| Example 3 | Y | Y | 8 | 3 | 29 | 30.5 | 21 | 27.5 | 14% | 5% |
| Example 4 | Y | Y | 4 | 1 | 18 | 19.5 | 14 | 15.5 | 11% | 3% |
| Example 5 | Y | Y | 16 | 12 | 57 | 54.5 | 41 | 42.5 | 14% | 11% |
| Example 6 | Y | Y | 2 | 6 | 56 | 57 | 54 | 51 | 2% | 5% |
| Example 7 | Y | Y | 7 | 5 | 46.5 | 42 | 39.5 | 37 | 8% | 6% |
| Example 8 | Y | Y | 5 | 0 | 45.5 | 32 | 40.5 | 32 | 5% | 0% |
| Example 9 | Y | Y | 3 | 1 | 53.6 | 48 | 50.5 | 47 | 3% | 1% |
| Comparative Example 1 | N | N | 82 | 85 | 61 | 70 | −21 | −15 | 87% | 61% |
| Comparative Example 2 | N | N | 46 | 46 | 44.5 | 41 | −1.5 | −6 | 52% | 56% |
| Comparative Example 3 | N | N | 46 | 33 | 41.5 | 30 | −4.5 | −3 | 55% | 65% |
| Comparative Example 4 | N | N | 46 | 66 | 44 | 57.5 | −2 | −8.5 | 52% | 57% |
| Comparative Example 5 | — | — | — | — | — | — | — | — | — | — |
| Comparative Example 6 | N | N | 13 | 15 | 11 | 8.5 | −2 | −6.5 | 59% | 88% |
| Comparative Example 7 | N | N | 84 | 74 | 73 | 63.5 | −11 | −10.5 | 58% | 58% |

TABLE 2-continued

| | Is (Y − Z) < (Y/2) satisfied? | | Difference in the Amount of Warp Before and After Heat Treatment (Y − Z) | | Amount of Provided Warp/2 (Y/2) | | (Y/2) − (Y − Z) | | (Y − Z)/Y | |
|---|---|---|---|---|---|---|---|---|---|---|
| | Long Side | Short Side | Long Side | Short Side | Long Side | Short Side | Long Side | Short Side | Long Side | Short Side |
| Comparative Example 8 | N | N | 70 | 64 | 56.5 | 60.5 | −13.5 | −3.5 | 62% | 53% |

Example 2

Other than a mold having a curvature radius of 7,000 mm being used, a base plate was treated using a method completely identical to that of Example 1. The amount of warp at each step is shown in Tables 1 and 2.

Example 3

Other than a mold having a curvature radius of 20,000 mm being used, a base plate was treated using a method completely identical to that of Example 1. The amount of warp at each step is shown in Tables 1 and 2.

Example 4

Other than a mold having a curvature radius of 30,000 mm being used, a base plate was treated using a method completely identical to that of Example 1. The amount of warp at each step is shown in Tables 1 and 2.

Example 5

Other than the surface temperature of the mold being set to 560° C., the press pressure being set to 10 KPa, and maintaining for 0.5 minutes (30 seconds) from the point at which the temperature of the base plate became 550° C., a base plate was treated using a method completely identical to that of Example 1. The amount of warp at each step is shown in Tables 1 and 2.

Example 6

Other than the surface temperature of the mold being set to 530° C., the press pressure being set to 30 KPa, and maintaining for 4 minutes from the point at which the temperature of the base plate became 520° C., a base plate was treated using a method completely identical to that of Example 1. The amount of warp at each step is shown in Tables 1 and 2.

Example 7

Other than a mold having a radius curvature of 15,000 mm being used, the surface temperature of the mold being set to 560° C., the press pressure being set to 10 KPa, maintaining for 0.5 minutes (30 seconds) from the point at which the temperature of the base plate became 550° C., and further, setting the heat treatment following the provision of warp to 3 hours at 270° C., a base plate was treated using a method completely identical to that of Example 1. The amount of warp at each step is shown in Tables 1 and 2.

Example 8

Other than a mold having a radius curvature of 15,000 mm being used, the press pressure being set to 40 KPa and the maintenance time to 4 minutes, and further, setting the heat treatment following the provision of warp to 3 hours at 270° C., a base plate was treated using a method completely identical to that of Example 2. The amount of warp at each step is shown in Tables 1 and 2.

Example 9

Other than the a mold having a radius curvature of 15,000 mm being used, the surface temperature of the mold being set to 530° C., the press pressure being set to 30 KPa, maintaining for 3 minutes from the point at which the temperature of the base plate became 520° C., and further, setting the heat treatment following the provision of warp to 3 hours at 270° C., a base plate was treated using a method completely identical to that of Example 3. The amount of warp at each step is shown in Tables 1 and 2.

Comparative Example 1

Other than the surface temperature of the mold being set to 560° C., the press pressure being set to 8 KPa, and maintaining for 3 minutes from the point in time at which the temperature of the base plate became 550° C., a base plate was treated using a method completely identical to that of Example 1. The amount of warp at each step is shown in Tables 1 and 2.

Comparative Example 2

Other than the temperature of the mold being set to 440° C., the temperature of the base plate being set to 430° C., the press pressure being set to 10 KPa, and the pressing time being set to 05 minutes (30 seconds), a base plate was treated using a method completely identical to that of Example 1. The amount of warp at each step is shown in Tables 1 and 2.

Comparative Example 3

Other than the temperature of the mold being set to 530° C., the temperature of the base plate being set to 520° C., the press pressure being set to 30 KPa, and the maintenance time being set to 0.25 minutes (15 seconds), a base plate was treated using a method completely identical to that of Example 4. The amount of warp at each step is shown in Tables 1 and 2.

Comparative Example 4

Other than a mold having a radius curvature of 15,000 mm being used, the temperature of the mold being set to 560° C., the temperature of the base plate being set to 550° C., the press pressure being set to 10 KPa, the maintenance time being set to 0.25 minutes (15 seconds), and further, setting the heat treatment following the provision of warp to 3 hours at 270° C., a base plate was treated using a method completely identical to that of Example 1. The amount of warp at each step is shown in Tables 1 and 2.

Comparative Example 5

Other than a mold having a curvature radius of 5,000 mm being used and the pressing time being set to 4 minutes, a base plate was treated using a method completely identical to that of Example 1. Cracks were confirmed in the base plate during visual inspection following the provision of warp.

Comparative Example 6

Other than a mold having a curvature radius of 35,000 mm being used, a base plate was treated using a method completely identical to that of Example 1. The amount of warp at each step is shown in Tables 1 and 2.

Comparative Example 7

A base plate obtained with the impregnation method and machining of the periphery in Example 1 and for which the warp has already been measured was placed in a 160 mm×120 mm cavity with a depth of 5 mm and the center of the base plate was fastened with a screw and bent with the edge of the cavity as a fulcrum. In this state, the cavity and base plate were inserted into a furnace, heated at 550° C. for 30 minutes, and thereafter, cooled. Following this, the screw fastening was released, heat treatment at 320° C. was performed for 2 hours after the provided warp was measured, and the warp was measured once again. The results are shown in Tables 1 and 2.

Comparative Example 8

Other than the heating in the screw-fastened state being performed at 450° C. for 30 minutes and the heat treatment following the release of the screw fastening being set to 320° C. for 1 hour, treatment was performed under conditions completely identical to Comparative Example 7. The results are shown in Tables 1 and 2.

As can be understood from Tables 1 and 2, a heat dissipation component manufactured via the method of manufacturing of the present invention has the effects of warp return after joining a circuit board being small and superior heat dissipation.

As above, according to the method of the present invention, a heat dissipation component having small warp return at such times as when joining with a circuit board, and through packaging following such joining, having a stable convex shape on a radiating fin side can be manufactured, with the consequent result that it can be expected that modules having high heat dissipation and high reliability over long periods can be steadily provided.

EXPLANATION OF THE REFERENCE NUMBERS

1 Heat dissipation component
2 Press convex mold
3 Press concave mold

The invention claimed is:

1. A method for manufacturing a flat plate-shaped heat dissipation component having a warp and including a composite part having silicon carbide and an aluminum alloy, the method comprising:
   sandwiching the heat dissipation component is in a concave-convex mold including a pair of opposing spherical surfaces having a radius curvature of 20,000-30,000 mm and a surface temperature of at least 450° C.; and
   pressing the heat dissipation component at a stress of at least 10 KPa for at least 30 seconds causing the temperature of the heat dissipation component to be at least 450° C., wherein:
   (Y−Z) of both a long side and a short side of the heat dissipation component is no greater than 18 μm, where X is an amount of warp per 10 cm prior to warp being provided, (X+Y) is the amount of warp per 10 cm after warp has been provided, and (X+Z) is the amount of warp per 10 cm after heat treating the heat dissipation component at no greater than 320° C. for at least 1 hour following the warp being provided.

2. The method for manufacturing the heat dissipation component of claim 1, wherein the manufactured heat dissipation component manufactured satisfies a relationship between Y and Z of:

(Y−Z)<(Y/2), where X is the amount of warp per 10 cm prior to warp being provided, (X+Y) is the amount of warp per 10 cm after warp has been provided, and (X+Z) is the amount of warp per 10 cm after heat treating the heat dissipation component at no greater than 320° C. for at least 1 hour following the warp being provided.

3. The method for manufacturing the heat dissipation component of claim 1, wherein the manufactured heat dissipation component satisfies (Y/2)−(Y−Z) is equal to 1-80 μm, where X is the amount of warp per 10 cm prior to warp being provided, (X+Y) is the amount of warp per 10 cm after warp has been provided, and (X+Z) is the amount of warp per 10 cm after heat treating the heat dissipation component at no greater than 320° C. for at least 1 hour following the warp being provided.

4. A heat dissipation component manufactured via the method for manufacturing of claim 1.

* * * * *